United States Patent
Okuyama et al.

(10) Patent No.: US 7,633,825 B2
(45) Date of Patent: Dec. 15, 2009

(54) SEMICONDUCTOR MEMORY DEVICE WITH REDUCED CURRENT CONSUMPTION

(75) Inventors: Yoshiaki Okuyama, Kawasaki (JP); Atsushi Takeuchi, Kawasaki (JP); Tomohiro Kawakubo, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 237 days.

(21) Appl. No.: 11/798,629

(22) Filed: May 15, 2007

(65) Prior Publication Data
US 2007/0268769 A1    Nov. 22, 2007

(30) Foreign Application Priority Data
May 18, 2006   (JP) .............................. 2006-139055

(51) Int. Cl.
*G11C 7/00* (2006.01)
(52) U.S. Cl. .................. 365/227; 365/189.09; 365/226; 365/229
(58) Field of Classification Search ................. 365/227, 365/189.09, 226, 229
See application file for complete search history.

(56) References Cited

U.S. PATENT DOCUMENTS

| | | | |
|---|---|---|---|
| 5,463,588 A | 10/1995 | Chonan | |
| 6,262,931 B1 * | 7/2001 | Kono et al. | 365/189.09 |
| 6,381,182 B1 | 4/2002 | McStay | |
| 6,515,929 B1 | 2/2003 | Ting et al. | |
| 6,518,834 B2 * | 2/2003 | Gerber | 327/544 |
| 6,996,023 B2 | 2/2006 | Kim | |
| 7,006,401 B2 * | 2/2006 | Takahashi et al. | 365/222 |
| 7,221,616 B2 * | 5/2007 | Jeon | 365/230.06 |
| 7,251,169 B2 * | 7/2007 | Takeuchi | 365/189.09 |

FOREIGN PATENT DOCUMENTS

| | | |
|---|---|---|
| EP | 07108186.3 | 11/2007 |
| JP | 07-105682 | 4/1995 |

* cited by examiner

*Primary Examiner*—Connie C Yoha
(74) *Attorney, Agent, or Firm*—Arent Fox LLP

(57) ABSTRACT

A semiconductor memory device includes a DRAM memory core circuit including a word line, a power supply circuit configured to operate in a selected one of a first state and a second state to generate a predetermined power supply voltage for provision to the DRAM memory core circuit, the power supply circuit consuming a larger electric current in the first state than in the second state, and a control circuit configured to control the power supply circuit such that the power supply circuit is shifted from the first state to the second state, and is then brought back to the first state during a period from activation of the word line to deactivation of the word line.

15 Claims, 13 Drawing Sheets

SEMICONDUCTOR MEMORY DEVICE WITH REDUCED CURRENT CONSUMPTION

CROSS-REFERENCE TO RELATED APPLICATIONS

The present application is based upon and claims the benefit of priority from the prior Japanese Patent Application No. 2006-139055 filed on May 18, 2006, with the Japanese Patent Office, the entire contents of which are incorporated herein by reference.

BACKGROUND OF THE INVENTION

1. Field of the Invention

The present invention generally relates to semiconductor memory devices, and particularly relates to a DRAM (Dynamic Random Access Memory).

2. Description of the Related Art

Conventionally, SRAMs (Static Random Access Memories) are typically used as memory devices in certain types of electronic apparatuses such as portable phones. However, SRAMs generally have small circuit density, so that an attempt to increase memory capacity results in a significant cost increase. In contrast, DRAMs are suitable to provide a large memory capacity at low cost. In order to utilize the past assets of system configurations using SRAMs, thus, SRAM-compatible DRAMs having an interface compatible with that of SRAMs are employed.

There are several aspects in which control methods are different between DRAM and SRAM. One of such differences is a timing specification regarding an address input at the time of data write/read operation. DRAM memory cells allow only a destructive read operation by which data contents are destroyed upon access operation, so that there is a need to restore the data of sense amplifiers to the memory cells at the time of data access operation. It is prohibited to access another memory cell by changing addresses during this restore operation.

In contrast, SRAM memory cells are basically comprised of flip-flops, and thus allow a nondestructive data read operation by which data contents are not destroyed upon access operation. Accordingly, in principle, the memory cell position to which read/write access is made can be changed at desired timing by following changes in input addresses. There is a need to prevent the unintended writing of data to an unintended address, so that provision is made for an SRAM write operation such that the write operation commences as a valid access operation upon the fixing of data inputs after the retention of address inputs for a predetermined period.

In consideration of this, a DRAM designed to be compatible with the operation of an SRAM is configured such that an operation to the memory core for a read operation commences immediately after the inputting of the command, and an operation to the memory core for the write operation commences upon the end of the relevant write command cycle. Specifically, when both a chip-enable signal /CE and a write-enable signal /WE are asserted to LOW, block selection, word-line activation, and sense-amplifier activation are performed in response thereto with respect to the memory core circuit. When both the chip-enable signal /CE and the write-enable signal /WE are thereafter deasserted to HIGH, write data is fixed upon the rise edge of the write-enable signal /WE serving as a trigger, so that the write operation of specified data with respect to a specified address is performed with respect to the memory core circuit.

In the write operation as described above, there is a need for the memory core circuit to wait in the active state from the time the write-enable signal /WE is asserted to the time the write operation is performed in response to the deassertion of the write-enable signal /WE. During this period, the power supply circuit supplying a power supply voltage to the memory core circuit is also kept in the active state.

In DRAMs, generally, a stepped-up voltage Vpp, a stepped-down voltage Vii, and so on are generated form the external power supply voltage Vdd, and are supplied to the memory core circuit. The stepped-up voltage Vpp is used to drive word lines, and the stepped-down voltage Vii are used as the power supply voltage of the memory core circuit. In order to generate the stepped-up voltage and stepped-down voltage, power supply circuits such as a stepped-up voltage generating circuit and a stepped-down voltage generating circuit are used.

The stepped-up voltage generating circuit includes a detection circuit and a pump circuit. Upon the detection of a drop of the stepped-up voltage by the detection circuit, the pump circuit starts driving to boost the stepped-up voltage. The detection circuit uses a differential amplifier to detect a difference between a reference voltage Vref and a voltage made by dividing the stepped-up voltage Vpp, and supplies the outcome of the detection to the pump circuit. When the stepped-up voltage Vpp drops, the voltage made by dividing the stepped-up voltage Vpp becomes smaller than the reference voltage Vref. In response, the pump circuit starts driving to boost the stepped-up voltage Vpp.

A bias current flowing through the differential amplifier is set to an appropriate current amount in response to whether the memory core circuit is in the active state or in the inactive state. The operation speed of the differential amplifier is fast when the bias current is large. In this case, thus, it is possible to perform proper potential detection by following a sudden change in the stepped-up voltage Vpp. Accordingly, the bias current is increased to sufficiently increase the response speed of the power supply circuit when the memory core circuit is in the active state. When the memory core circuit is in the inactive state, on the other hand, the bias current is decreased to reduce needless current consumption.

Alternatively, provision may be made such that two detectors (differential amplifiers) having different response speeds and different current consumption levels are provided. The detector having faster response speed and larger current consumption is used to sufficiently increase the response speed of the power supply circuit when the memory core circuit is in the active state. When the memory core circuit is in the inactive state, on the other hand, the detector having slower response speed and smaller current consumption is used to reduce needless current consumption.

As previously described, in the write operation of an SRAM-compatible DRAM, the power supply circuit supplying a power supply voltage to the memory core circuit is placed in the active state from the time the write-enable signal /WE is asserted to the time the write operation is performed in response to the deassertion of the write-enable signal /WE. Namely, the power supply circuit supplying a power supply voltage to the memory core circuit is placed in the active state during a wait period in which a write operation is not performed with respect to the memory cells of the memory core circuit, thereby resulting in the consumption of needless electric currents. The power supply circuit continues to consume an electric current for a long period until a write operation actually commences even when the command cycle is a long cycle so that the period from the assertion of the write-enable signal /WE to the deassertion thereof is relatively long.

[Patent Document 1] Japanese Patent Application Publication No. 07-105682

Accordingly, there is a need for a semiconductor memory device that can reduce current consumption in its power supply circuit during a period in which the memory core circuit is waiting in the active state for the start of a data write operation.

SUMMARY OF THE INVENTION

It is a general object of the present invention to provide a semiconductor memory device that substantially obviates one or more problems caused by the limitations and disadvantages of the related art.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a semiconductor memory device particularly pointed out in the specification in such full, clear, concise, and exact terms as to enable a person having ordinary skill in the art to practice the invention.

To achieve these and other advantages in accordance with the purpose of the invention, the invention provides a semiconductor memory device which includes a DRAM memory core circuit including a word line, a power supply circuit configured to operate in a selected one of a first state and a second state to generate a predetermined power supply voltage for provision to the DRAM memory core circuit, the power supply circuit consuming a larger electric current in the first state than in the second state, and a control circuit configured to control the power supply circuit such that the power supply circuit is shifted from the first state to the second state and is then brought back to the first state during a period from activation of the word line to deactivation of the word line.

According to at least one embodiment of the present invention, even during the ongoing operation of the memory core circuit, the power supply circuit is shifted from an active state to a standby state to reduce power consumption when a word line is activated in a wait state waiting for data to be written.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

In the following, embodiments of the present invention will be described with reference to the accompanying drawings.

Figure 1:
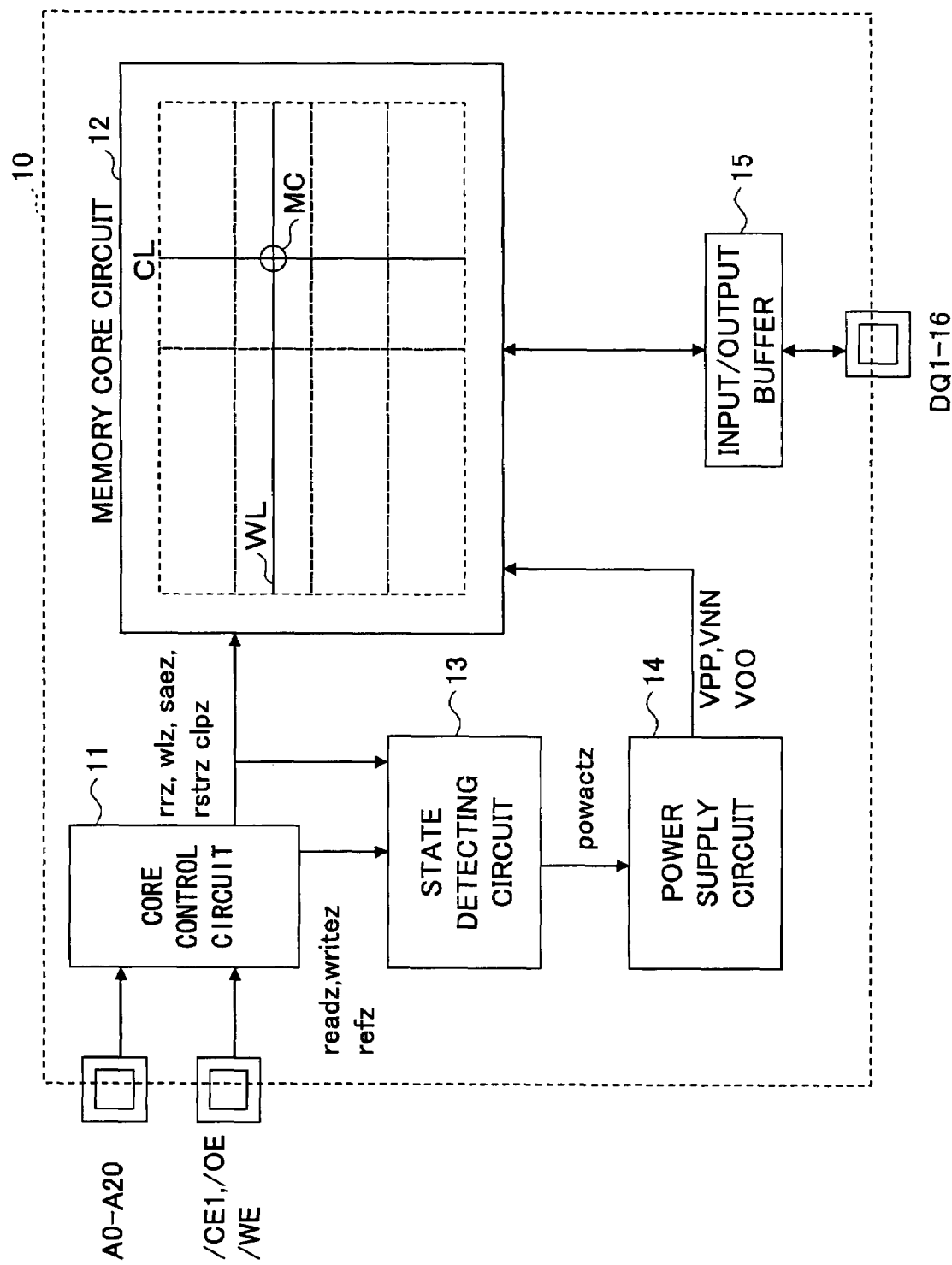
FIG. 1 is a drawing showing an example of the configuration of a semiconductor memory device according to the present invention.

FIG. 1 is a drawing showing an example of the configuration of a semiconductor memory device according to the present invention. A semiconductor memory device 10 of FIG. 1 includes a core control circuit 11, a memory core circuit 12, a state detecting circuit 13, a power supply circuit 14, and an input/output buffer 15.

The core control circuit 11 receives address signals A0 through A20 and control signals /CE1, /OE, and /WE via pads from an external source. /CE1, /OE, and /WE correspond to a chip-enable signal, an output-enable signal, and a write-enable signal, respectively. The core control circuit 11 decodes the address signals and control signals, and generates various control signals rrz, w/z, saez, rstrz, clpz, readz, writez, and refz in response to the decoded results. These control signals are supplied to the memory core circuit 12 and the state detecting circuit 13.

The memory core circuit 12 includes a memory array, a row decoder, a column decoder, etc. The column decoder decodes a column address supplied from an external source, and activates a column selecting line specified by the column address. The row decoder decodes a row address supplied from an external source, and activates a word line specified by the row address.

Data stored in memory cells MC (memory capacitors) connected to an activated word line WL are read to bit lines and amplified by sense amplifiers. In the case of read operation, the data amplified by the sense amplifiers is subjected to selection by an activated column selecting line CL, and the selected data is output to an exterior of the semiconductor memory device via the input/output buffer 15. In the case of write operation, write data is supplied from an external source outside the semiconductor memory device via the input/output buffer 15, and is written to sense amplifiers at the column address selected by an activated column selecting line CL. This write data and the data that were read from memory cells and ought to be restored are written to the memory cells connected to an activated word line WL.

The state detecting circuit 13 generates a power-supply-circuit activating signal powactz in response to the control signal generated by the core control circuit 11. The power-supply-circuit activating signal powactz is supplied to the power supply circuit 14.

The power supply circuit 14 enters into the active state in response to the HIGH (asserted) state of the power-supply-circuit activating signal powactz. The power supply circuit 14 enters into the standby state in response to the LOW (deasserted) state of the power-supply-circuit activating signal powactz. The power supply circuit 14 generates a stepped-up potential VPP, a stepped-up potential VOO, and a negative potential VNN for provision to the memory core circuit 12 in both the active state and the standby state.

The semiconductor memory device 10 of FIG. 1 is designed to provide an SRAM-compatible interface. The semiconductor memory device 10 is configured such that an operation to the memory core for a read operation commences immediately after the inputting of the command, and an operation to the memory core for the write operation commences upon the end of the relevant write command cycle. Specifically, when both the chip-enable signal /CE and the write-enable signal /WE are asserted to LOW, block selection, word-line activation, and sense-amplifier activation are performed in response thereto with respect to the memory core circuit 12. When both the chip-enable signal /CE and the write-enable signal /WE are thereafter deasserted to HIGH, write data is fixed upon the rise edge of the write-enable signal /WE serving as a trigger, so that the write operation of specified data with respect to a specified address is performed with respect to the memory core circuit 12.

In the write operation as described above, the memory core circuit does not consume an electric current during the period from the time the precharge ready state is achieved upon the completion of preparation of a write operation with respect to the memory core circuit 12 in response to the assertion of the write-enable signal /WE to the time the write operation is actually performed in response to the deassertion of the write-enable signal /WE. In the present invention, when the precharge ready state is achieved upon the completion of preparation of a write operation with respect to the memory core circuit 12, the power supply circuit 14 is placed in the standby state to reduce current consumption in the power supply circuit 14 until an actual write operation commences. When an actual write operation starts, the power supply circuit 14 is shifted into the active state.

Figure 2:
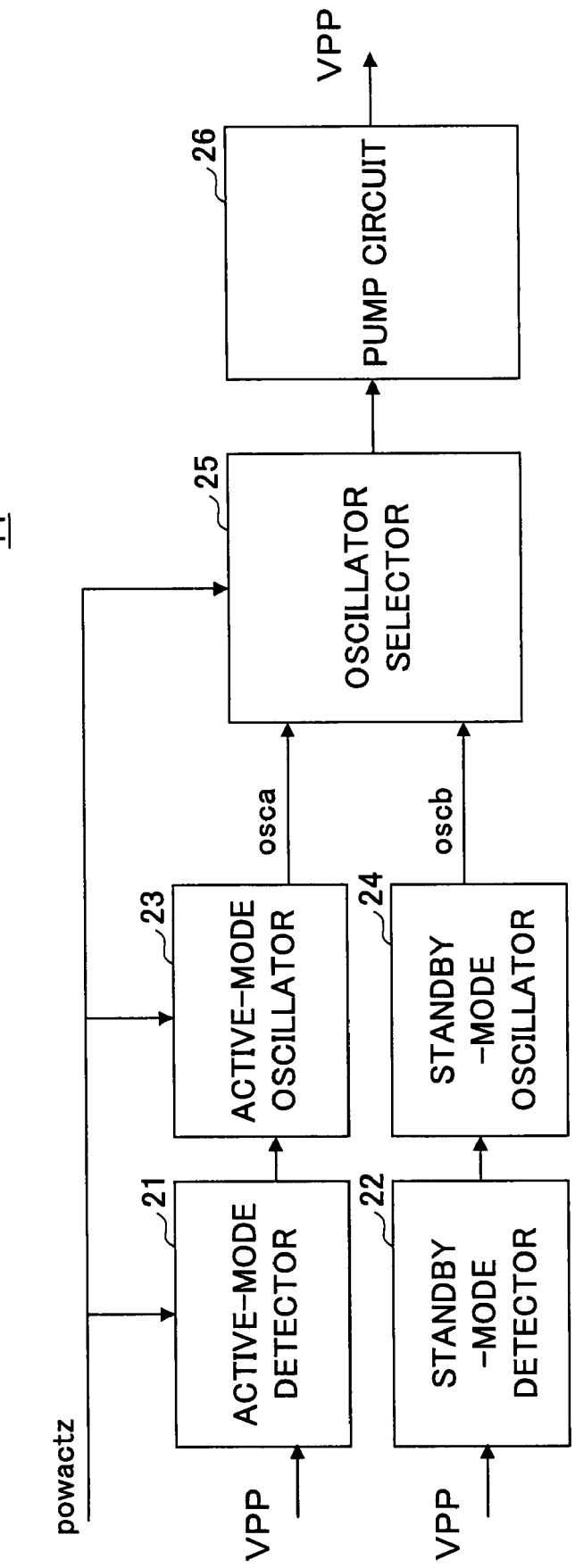
FIG. 2 is a drawing showing an example of the configuration of a power supply circuit.

FIG. 2 is a drawing showing an example of the configuration of the power supply circuit 14. The power supply circuit 14 shown in FIG. 2 is a portion that generates the stepped-up potential VPP, and includes an active-mode detector 21, a standby-mode detector 22, an active-mode oscillator 23, a standby-mode oscillator 24, an oscillator selector 25, and a pump circuit 26.

The active-mode detector 21 and the standby-mode detector 22 monitor the stepped-up potential VPP, and assert the respective detector outputs upon the stepped-up potential VPP becoming smaller than a predetermined potential. The active-mode oscillator 23 and the standby-mode oscillator 24 oscillate to generate respective oscillating signals osca and oscb in response to the assertion of the respective detector outputs from the active-mode detector 21 and the standby-mode detector 22. The oscillator selector 25 selects the oscillating signal osca for provision to the pump circuit 26 when the power-supply-circuit activating signal powactz is HIGH, and selects the oscillating signal oscb for provision to the pump circuit 26 when the power-supply-circuit activating signal powactz is LOW.

Based on the oscillating signal supplied from the oscillator selector 25, the pump circuit 26 repeats the cycle of charging and discharging of a capacitor by use of an external power supply voltage Vdd so as to generate the stepped-up potential VPP higher than the external power supply voltage Vdd by utilizing a phenomenon in which the voltage of accumulated charge of the capacitor is boosted by the external power supply voltage Vdd. The generated stepped-up potential VPP is supplied to the memory core circuit 12, and is used as the potential for activating a word line WL, for example.

The active-mode detector 21 has faster detection speed and larger current consumption than the standby-mode detector 22. Namely, each of the active-mode detector 21 and the standby-mode detector 22 may include a differential amplifier for comparing a reference voltage with a voltage made by dividing the stepped-up potential VPP, and the bias current flowing through the differential amplifier may differ between the active-mode detector 21 and the standby-mode detector 22, for example. The active-mode oscillator 23 has a shorter oscillating cycle and larger current consumption than the standby-mode oscillator 24.

The standby-mode detector 22 and the standby-mode oscillator 24 may operate all the time. The active-mode detector 21 and the active-mode oscillator 23 operate only when the power-supply-circuit activating signal powactz is HIGH.

When the power-supply-circuit activating signal powactz is HIGH, thus, the active-mode detector 21 and the active-mode oscillator 23 operate, and the oscillating signal osca having a shorter oscillating cycle is selected by the oscillator selector 25 and supplied to the pump circuit 26. In this manner, a drop of the stepped-up potential VPP is promptly detected when the power-supply-circuit activating signal powactz is HIGH, and the stepped-up potential VPP is rapidly boosted through a high-frequency pumping operation. The stepped-up potential VPP can thus be restored promptly to its desired potential. In this case, however, the active-mode detector 21 and the active-mode oscillator 23 operate so as to consume large electric currents.

When the power-supply-circuit activating signal powactz is LOW, on the other hand, the active-mode detector 21 and the active-mode oscillator 23 do not operate. In this case, the oscillating signal oscb having a longer oscillating cycle is selected by the oscillator selector 25 and supplied to the pump circuit 26. In this manner, a drop of the stepped-up potential VPP is detected relatively slowly when the power-supply-circuit activating signal powactz is LOW, and the stepped-up potential VPP is boosted relatively slowly through a low-frequency pumping operation. The stepped-up potential VPP is thus restored to its desired potential. In this case, however, the active-mode detector 21 and the active-mode oscillator 23 do not operate so that current consumption is relatively small.

The same configuration as that shown in FIG. 2 may be provided for each of the stepped-up potential VOO and the negative potential VNN. Namely, the power supply circuit 14 may be configured to switch between the active mode and the standby mode with respect to each of the stepped-up potential VOO and the negative potential VNN. With such configuration, it is possible to reduce current consumption or to achieve higher response speed depending on the situations.

Figure 3:
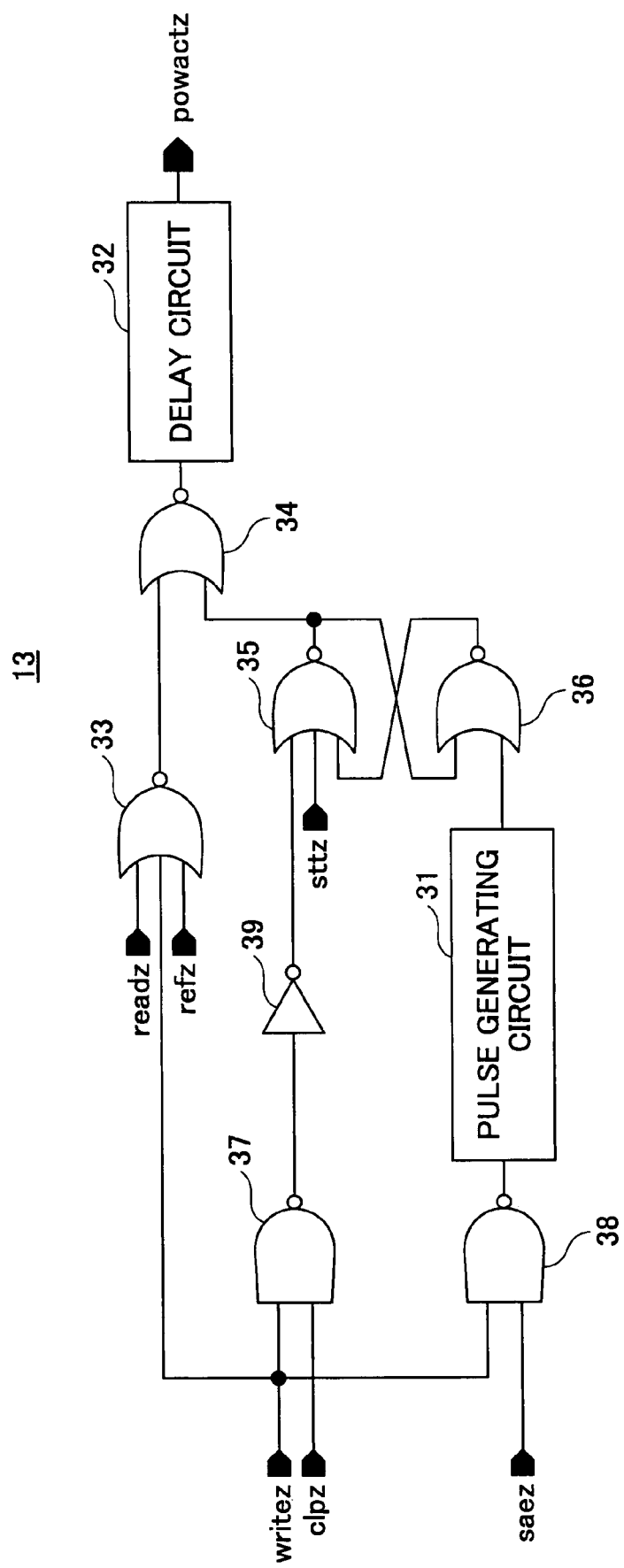
FIG. 3 is a drawing showing an example of the configuration of a state detecting circuit.

FIG. 3 is a drawing showing an example of the configuration of the state detecting circuit 13. The state detecting circuit 13 shown in FIG. 3 includes a pulse generating circuit 31, a delay circuit 32, NOR gates 33 through 36, NAND gates 37 through 38, and an inverter 39. Various control signals saez, clpz, readz, writez, and refz input into the state detecting circuit 13 are generated by the core control circuit 11. The signal saez is designed to become HIGH when activating sense amplifiers, the signal clpz designed to become HIGH when activating a column selecting line, the signal readz designed to be HIGH during the operation period of the memory core circuit 12 in the case of a read operation, the signal writez designed to be HIGH during the operation period of the memory core circuit 12 in the case of a write operation, and the signal refz designed to be HIGH during the operation period of the memory core circuit 12 in the case of a refresh operation. The signal sttz is an initializing signal, which is generated as a HIGH pulse at the time of power-on of the semiconductor memory device 10.

Figure 4:
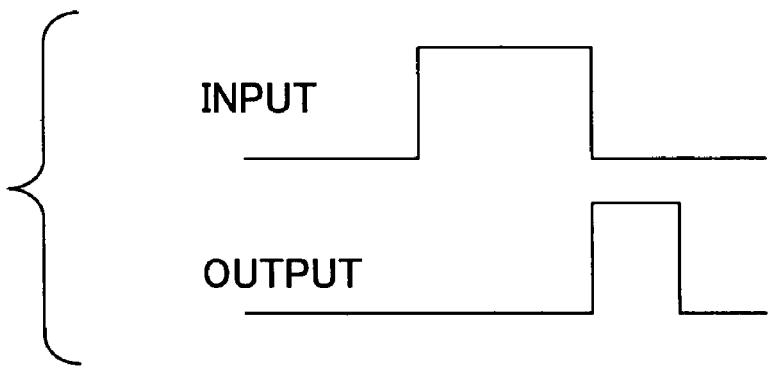
FIG. 4 is a waveform diagram showing the inputs/outputs of a pulse generating circuit.
Figure 5:
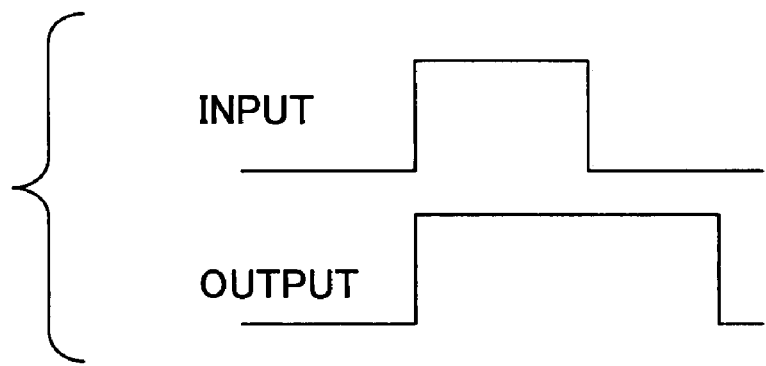
FIG. 5 is a waveform diagram showing the input/output of a delay circuit.

FIG. 4 is a waveform diagram showing the input/output of the pulse generating circuit 31. As shown in FIG. 4, the pulse generating circuit 31 generates a HIGH pulse in response to a falling edge of the input signal. FIG. 5 is a waveform diagram showing the input/output of the delay circuit 32. As shown in FIG. 5, the output of the delay circuit 32 immediately becomes HIGH in response to a rising edge of the input signal, and becomes LOW upon the passage of a predetermined delay time following a falling edge of the input signal. Namely, the delay circuit 32 serves to delay only the falling edge of the input signal so as to extend the pulse width of the input signal.

Turning back to FIG. 3, a latch comprised of the NOR gates 35 and 36 in the state detecting circuit 13 is caused by the initializing signal sttz to be in the latch state in which the output of the NOR gate 35 is LOW. In the case of a read operation or refresh operation, readz or refz input into the NOR gate 33 becomes HIGH, so that the output of the NOR gate 34 becomes HIGH, resulting the power-supply-circuit activating signal powactz being immediately changed to HIGH. The output of the NOR gate 34 thereafter becomes LOW in response to the change into LOW of readz or refz upon the completion of the read operation or refresh operation. In response, the power-supply-circuit activating signal powactz is changed to LOW after the predetermined delay time.

In the case of write operation, the power-supply-circuit activating signal powactz is immediately changed to HIGH in response to the HIGH state of writez input into the NOR gate 33. When the signal saez for activating sense amplifiers thereafter becomes HIGH, the output of the NAND gate 38 turns into LOW, resulting in the pulse generating circuit 31 producing a HIGH pulse. This HIGH pulse causes the state of the latch to be inverted, resulting in the output of the NOR gate 35 being HIGH. In response, the output of the NOR gate 34 is changed to LOW, and, thus, the power-supply-circuit activating signal powactz that is the output of the delay circuit 32 is changed to LOW after the predetermined delay time.

After this, an actual write operation starts. As the signal clpz for activating a column selecting line becomes HIGH, the output of the inverter 39 is changed to HIGH. This causes the state of the latch to be inverted, resulting in the output of the NOR gate 35 being LOW. In response, the output of the NOR gate 34 is changed to HIGH, and, thus, the power-supply-circuit activating signal powactz that is the output of the delay circuit 32 is immediately changed to HIGH.

Thereafter, the write operation with respect to the memory core circuit 12 comes to an end, resulting in writez being LOW. In response, the output of the NOR gate 34 is changed to LOW, and, thus, the power-supply-circuit activating signal powactz that is the output of the delay circuit 32 is changed to LOW after the predetermined delay time.

Figure 6:
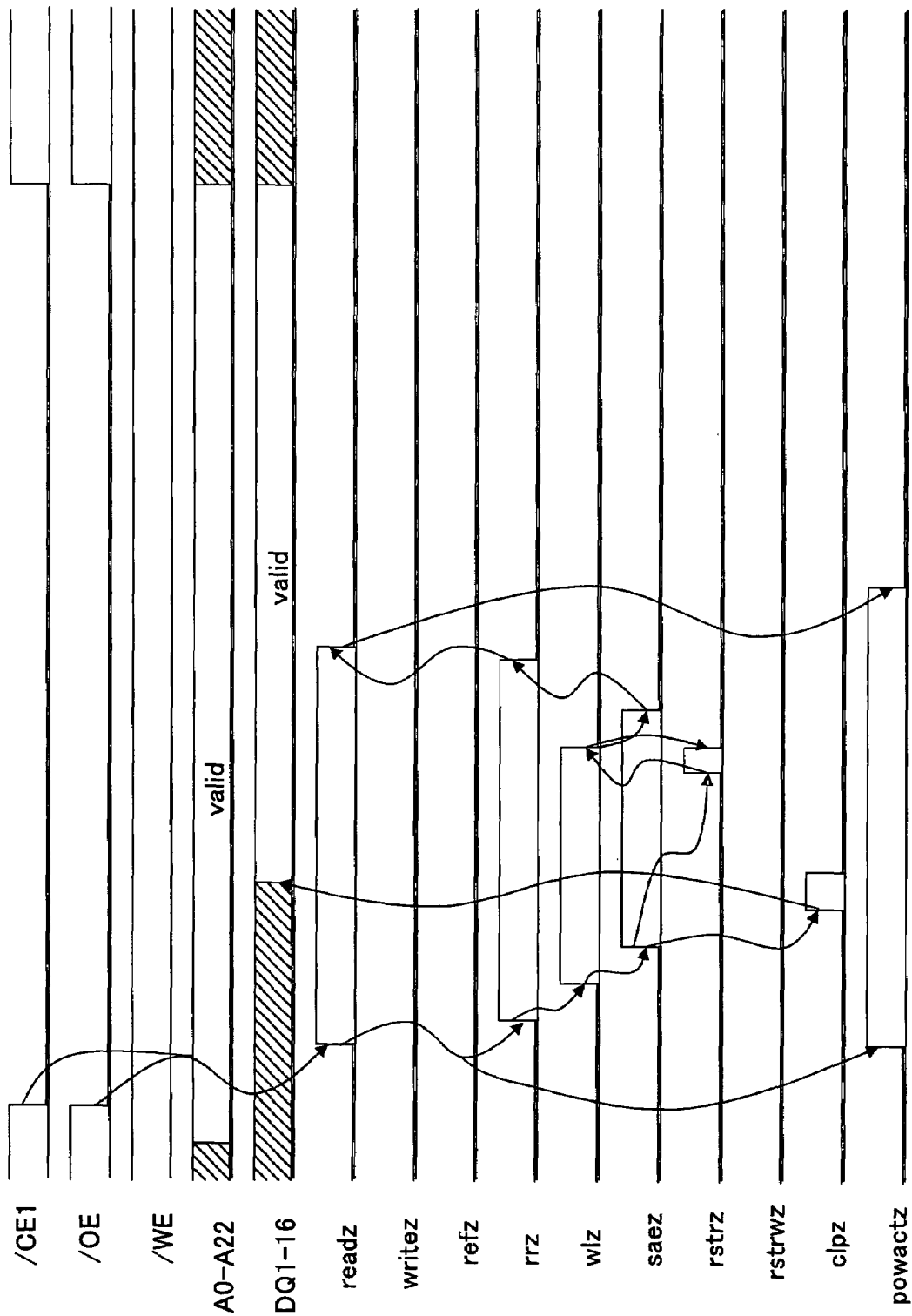
FIG. 6 is a timing chart for explaining the read operation of the semiconductor memory device shown in FIG. 1.

FIG. 6 is a timing chart for explaining the read operation of the semiconductor memory device 10 shown in FIG. 1. The read operation of the semiconductor memory device 10 will be described below by referring to FIG. 6.

In response to the LOW state of the chip-enable signal /CE1 and the output-enable signal /OE, the core control circuit 11 decodes input signals to determine the input command. It is determined that a read operation is requested since the output-enable signal /OE is LOW, so that the signal readz is set to HIGH. In response, the power-supply-circuit activating signal powactz is changed to HIGH to place the power supply circuit 14 in the active state. Further, a block selecting signal rrz is changed to HIGH, thereby selecting one of a plurality of blocks provided in the memory core circuit 12.

In response to the HIGH state of rrz, the word-line activating signal w/z becomes HIGH, so that one word line WL is activated in the selected block. In response to the HIGH state of w/z, the sense-amplifier activating signal saez becomes HIGH, so that the sense amplifiers in the selected block are activated. In response to the HIGH state of saez, the column-selecting-line activating signal clpz is generated as a HIGH pulse, so that a column selecting line CL is activated. Data are output from the memory core circuit 12 in response to the activation of the column selecting line CL, resulting in output data DQ1 through DQ16 being fixed.

In response to the HIGH state of saez, the restore completion signal rstrz becomes HIGH. The ongoing operation is a read operation in this example, so that w/z is changed to LOW in response to the HIGH state of rstrz, thereby deactivating the word line WL. After this, saez becomes LOW in response to the LOW state of w/z, deactivating the sense amplifiers. Further, rrz becomes LOW in response to the LOW state of saez, thereby deactivating the block selection. readz then becomes LOW in response to the LOW state of rrz, resulting in the core operation responsive to the read command coming to an end. In response to the LOW state of readz, the power-supply-circuit activating signal powactz is changed to LOW to place the power supply circuit 14 back in the standby state.

Figure 7:
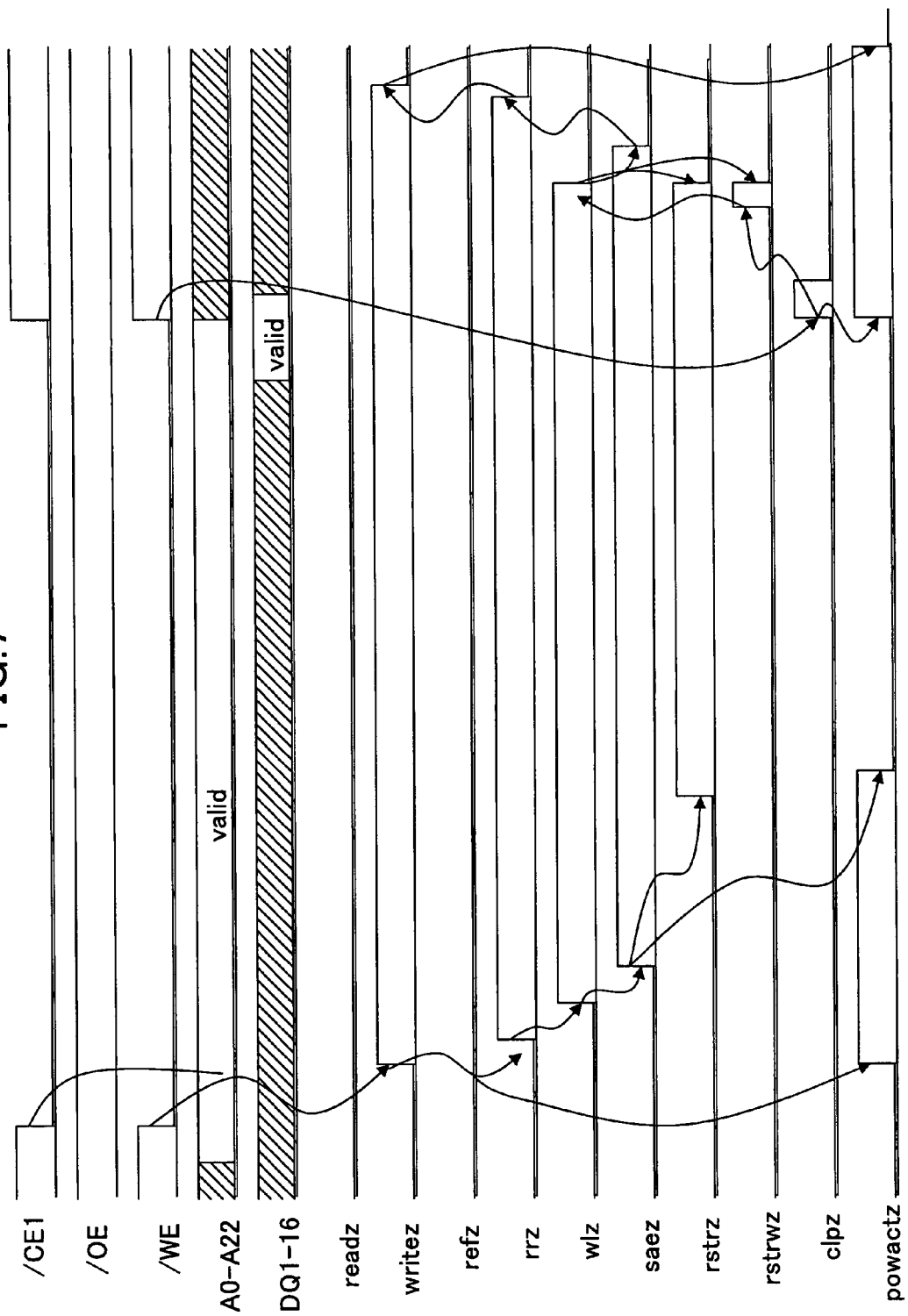
FIG. 7 is a timing chart for explaining the write operation of the semiconductor memory device shown in FIG. 1.

FIG. 7 is a timing chart for explaining the write operation of the semiconductor memory device 10 shown in FIG. 1. The write operation of the semiconductor memory device 10 will be described below by referring to FIG. 7.

In response to the LOW state of the chip-enable signal /CE1 and the write-enable signal /WE, the core control circuit 11 decodes input signals to determine the input command. It is determined that a write operation is requested since the write-enable signal /WE is LOW, so that the signal writez is set to HIGH. In response, the power-supply-circuit activating signal powactz is changed to HIGH to place the power supply circuit 14 in the active state. Further, a block selecting signal rrz is changed to HIGH, thereby selecting one of a plurality of blocks provided in the memory core circuit 12.

In response to the HIGH state of rrz, the word-line activating signal w/z becomes HIGH, so that one word line WL is activated in the selected block. In response to the HIGH state of w/z, the sense-amplifier activating signal saez becomes HIGH, so that the sense amplifiers in the selected block are activated.

Any one of the column selecting lines CL is ready to be activated after the activation of sense amplifiers. In the case of a write operation, however, a column selecting line CL cannot be activated unless write data is fixed. Since the example shown in FIG. 7 is directed to the use of a long cycle, the fixing of data (i.e., "valid" of DQ1-16) occurs only after a significant delay following the LOW-to-HIGH transition of saez.

Although the restore completion signal rstrz becomes HIGH in response to the HIGH state of saez, the deactivation of a word line WL does not occur in the case of a write operation unlike the case of a read operation. In this state, no electric current is consumed in the memory core circuit 12, so that the power-supply-circuit activating signal powactz is changed to LOW after the passage of a predetermined delay time following the LOW-to-HIGH transition of saez, thereby placing the power supply circuit 14 in the standby state. In a case other than the case of a long cycle, clpz becomes HIGH before the time comes for powactz to become LOW after the passage of the predetermined delay time, so that powactz does not actually change to LOW, and the power supply circuit 14 is not placed in the standby state.

Since data is fixed in response to the HIGH state of the write-enable signal /WE, a HIGH pulse of clpz is generated to write data to the memory core circuit 12. In response to the HIGH pulse of clpz, the power-supply-circuit activating signal powactz is changed to HIGH to place the power supply circuit 14 back in the active state. As the signal rstrwz becomes HIGH to indicate that the restoration of data written to the memory core circuit 12 is sufficient, w/z changes to LOW, thereby deactivating the word line WL.

After this, saez becomes LOW in response to the LOW state of w/z, deactivating the sense amplifiers. Further, rrz becomes LOW in response to the LOW state of saez, thereby deactivating the block selection. writez then becomes LOW in response to the LOW state of rrz, resulting in the core operation responsive to the write command coming to an end. In response to the LOW state of writez, the power-supply-circuit activating signal powactz is changed to LOW to place the power supply circuit 14 back in the standby state.

Figure 8:
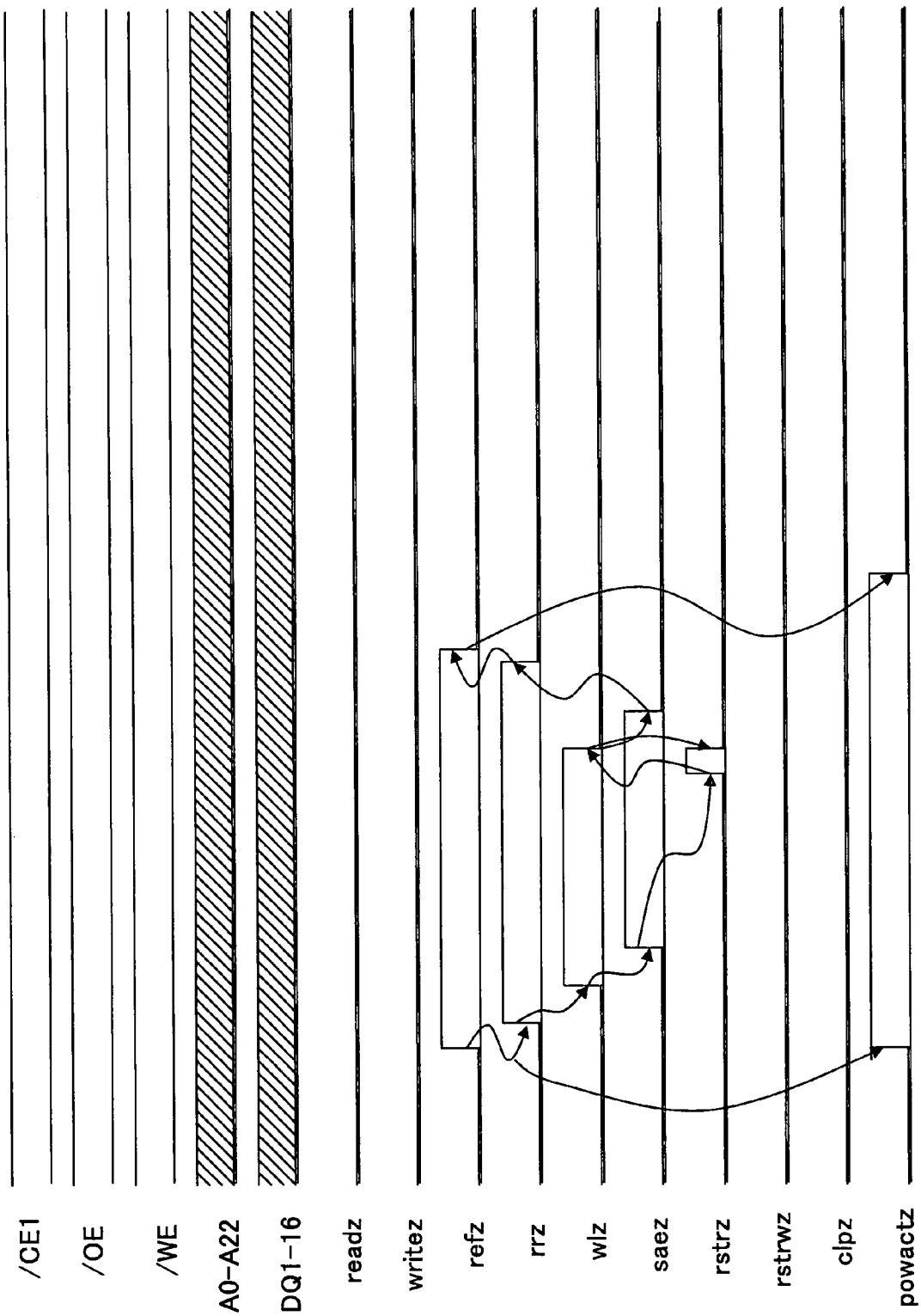
FIG. 8 is a timing chart for explaining the refresh operation of the semiconductor memory device shown in FIG. 1.

FIG. 8 is a timing chart for explaining the refresh operation of the semiconductor memory device 10 shown in FIG. 1. The refresh operation of the semiconductor memory device 10 will be described below by referring to FIG. 8.

No inputting of an external command is required in the case of a refresh operation since refresh operations are automatically performed inside the semiconductor memory device 10. In response to the HIGH state of refz, the power-supply-circuit activating signal powactz is changed to HIGH to place the power supply circuit 14 in the active state.

Further, a block selecting signal rrz is changed to HIGH, thereby selecting one of a plurality of blocks provided in the memory core circuit 12. In response to the HIGH state of rrz, the word-line activating signal w/z becomes HIGH, so that one word line WL is activated in the selected block. In response to the HIGH state of w/z, the sense-amplifier activating signal saez becomes HIGH, so that the sense amplifiers in the selected block are activated.

In response to the HIGH state of saez, the restore completion signal rstrz becomes HIGH. The ongoing operation is a refresh operation in this example, so that w/z is changed to LOW in response to the HIGH state of rstrz, thereby deactivating the word line WL. After this, saez becomes LOW in response to the LOW state of w/z, deactivating the sense amplifiers. Further, rrz becomes LOW in response to the LOW state of saez, thereby deactivating the block selection. refz then becomes LOW in response to the LOW state of rrz, resulting in the core operation of the refresh operation coming to an end. In response to the LOW state of refz, the power-supply-circuit activating signal powactz is changed to LOW to place the power supply circuit 14 back in the standby state.

As described above, the semiconductor memory device 10 of FIG. 1 is configured such that the power supply circuit 14 is placed in the active state at all times during the operation of memory core circuit 12 in the case of a read operation or refresh operation. In the case of a write operation, on the other hand, even during the ongoing operation of the memory core circuit 12, the power supply circuit 14 is shifted from the active state to the standby state to reduce power consumption when a word line and sense amplifiers are activated in a wait state waiting for data to be written.

Figure 9:
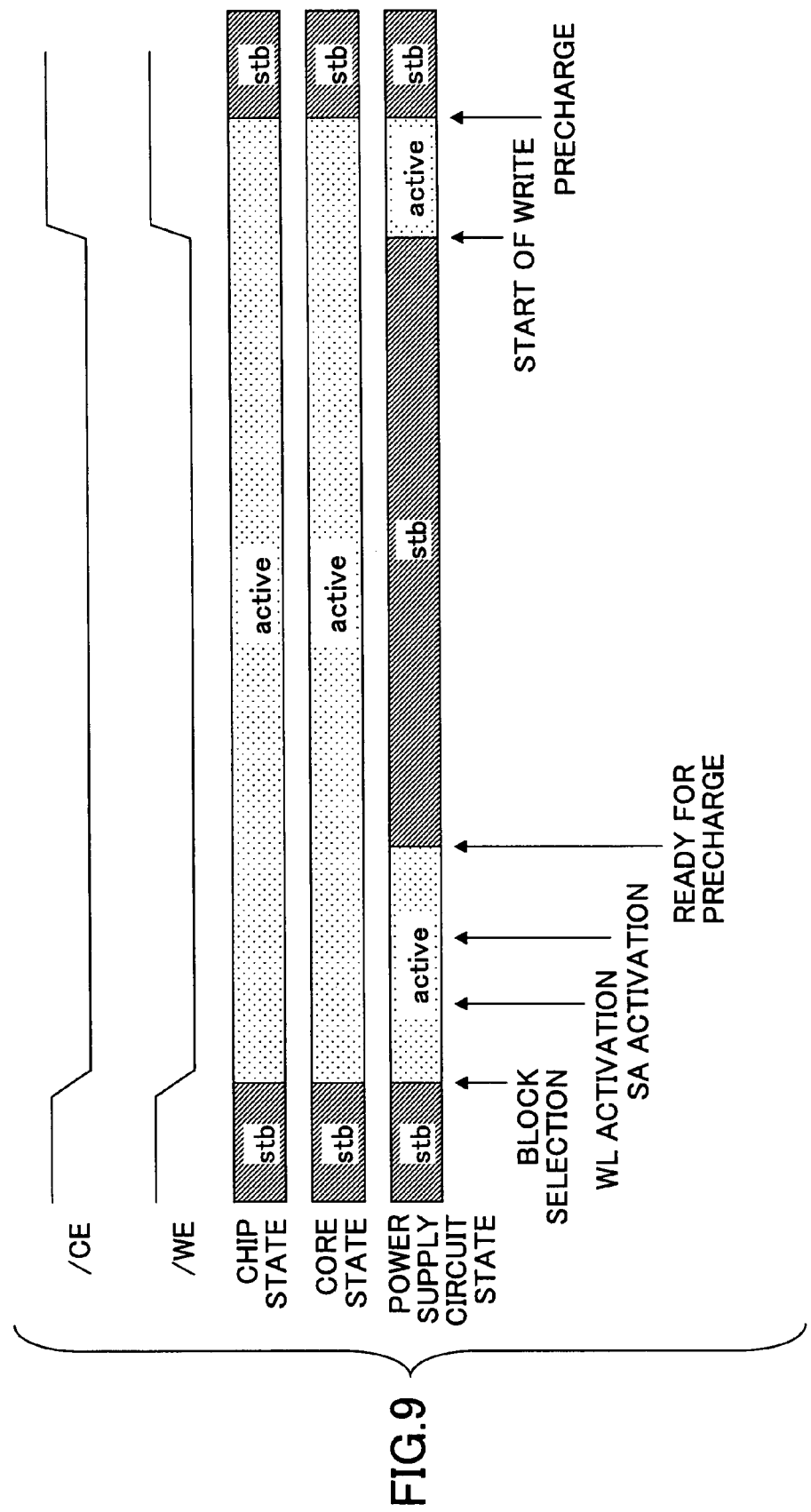
FIG. 9 is a drawing for explaining the states of the semiconductor memory device, the memory core circuit, and the power supply circuit in write operation.

FIG. 9 is a drawing for explaining the states of the semiconductor memory device 10, the memory core circuit 12, and the power supply circuit 14 in write operation. When both the chip-enable signal /CE and the write-enable signal /WE are asserted to LOW as shown in FIG. 9, the semiconductor memory device 10, memory core circuit 12, and power supply circuit 14 are shifted from the standby state (stb) to the active state (active) in response to such assertion. When block selection, the activation of a word line WL, and the activation of sense amplifiers SA are performed with respect to the memory core circuit 12 that is in the active state, the memory core circuit 12 is placed in a precharge-ready state following the completion of preparation for a write operation (i.e., placed in a state in which the data amount is sufficient upon the activation of the word line and sense amplifiers). Thereafter, the power supply circuit 14 is placed in the standby state (stb) to reduce current consumption in the power supply circuit 14 for a time being before an actual write operation commences.

When both the chip-enable signal /CE and the write-enable signal /WE are thereafter deasserted to HIGH, write data is fixed upon the rise edge of the write-enable signal /WE serving as a trigger, so that the write operation of specified data with respect to a specified address is performed with respect to the memory core circuit 12. In so doing, the power supply circuit 14 is returned to the activate state (active) by using the column-selecting-line activating signal as a trigger as previously described. This makes it possible for the power supply circuit 14 to respond, with sufficient response speed, to the voltage fluctuation that occurs due to the write operation with respect to the memory core circuit 12.

The embodiments described above have been directed to a case in which the present invention is applied to an SRAM-compatible DRAM. It should be noted, however, that the semiconductor memory device to which the present invention is applicable is not limited to an SRAM-compatible DRAM, and may be an ordinary DRAM. In the following, a description will be given of a case in which the present invention is applied to an ordinary DRAM.

Figure 10:
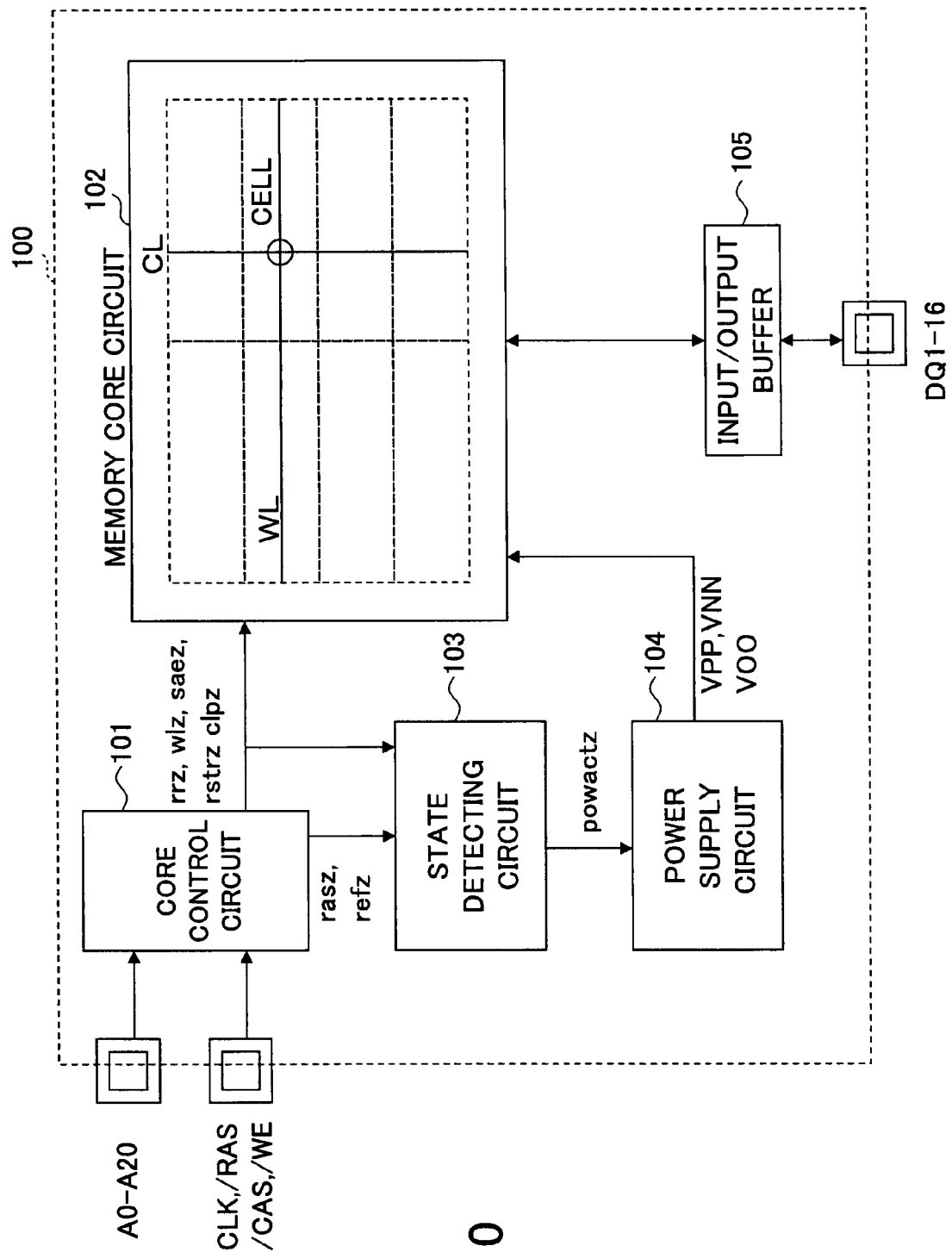
FIG. 10 is a drawing showing an example of the configuration of a semiconductor memory device according to the present invention.

FIG. 10 is a drawing showing an example of the configuration of a semiconductor memory device according to the present invention. A semiconductor memory device 100 of FIG. 10 is an SDRAM (Synchronous Dynamic Random Access Memory), and includes a core control circuit 101, a memory core circuit 102, a state detecting circuit 103, a power supply circuit 104, and an input/output buffer 105.

The core control circuit 101 receives address signals A0 through A20, a clock signal CLK, and control signals /RAS, /CAS, and /WE via pads from an external source. /RAS, /CAS, and /WE correspond to a row-address strobe signal, a column-address strobe signal, and a write-enable signal, respectively. The core control circuit 101 decodes the address signals and control signals, and generates various control signals rrz, w/z, saez, rstrz, clpz, rasz, and refz in response to the decoded results. These control signals are supplied to the memory core circuit 102 and the state detecting circuit 103.

The configuration and operation of the memory core circuit 102 are the same as those of the memory core circuit 12 shown in FIG. 1. The state detecting circuit 103 generates a power-supply-circuit activating signal powactz in response to the control signal generated by the core control circuit 101. The power-supply-circuit activating signal powactz is supplied to the power supply circuit 104. The configuration and operation of the power supply circuit 104 are the same as those of the power supply circuit 14 shown in FIG. 1, and such configuration is shown in FIG. 2.

Figure 11:
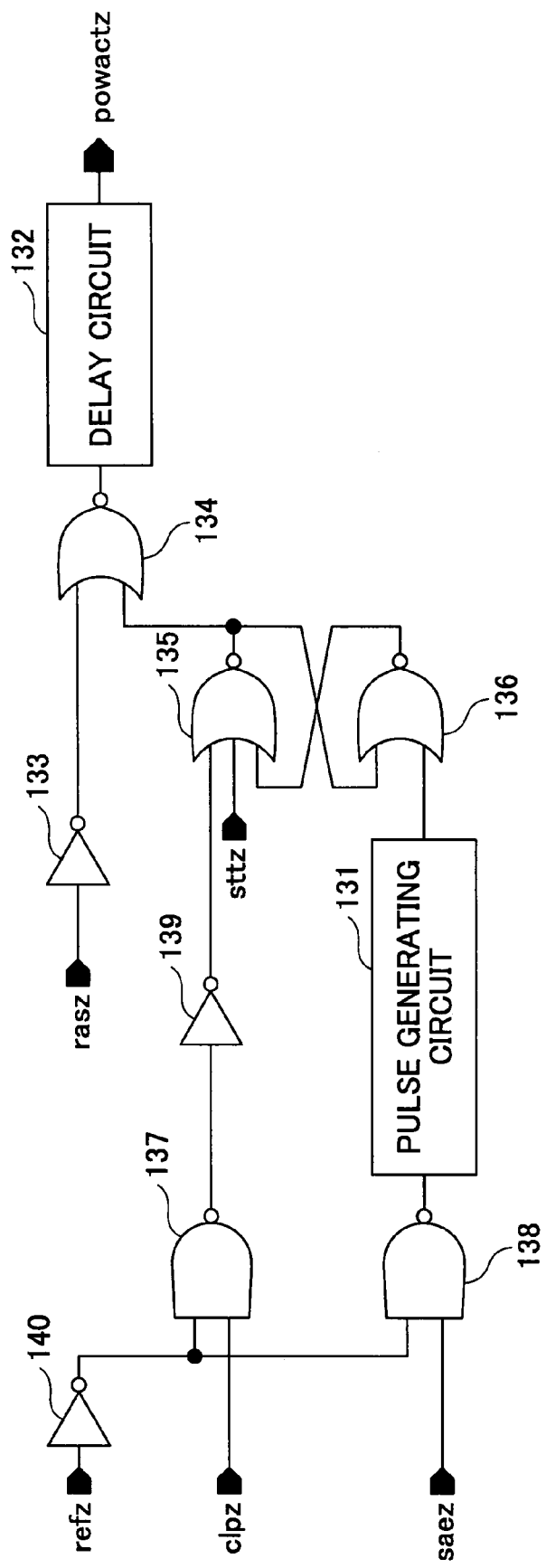
FIG. 11 is a drawing showing an example of the configuration of a state detecting circuit.

FIG. 11 is a drawing showing an example of the configuration of the state detecting circuit 103. The state detecting circuit 103 shown in FIG. 11 includes a pulse generating circuit 131, a delay circuit 132, an inverter 133, NOR gates 134 through 136, NAND gates 137 and 138, and inverters 139 and 140. Various control signals saez, clpz, rasz, and refz input into the state detecting circuit 103 are generated by the core control circuit 101. The signal saez is designed to become HIGH when activating sense amplifiers, the signal clpz designed to become HIGH when activating a column selecting line, the signal rasz designed to be HIGH during the period in which the memory core circuit 102 is in the active state (i.e., when a word line WL is in the activated state), and the signal refz designed to be HIGH during the operation period of the memory core circuit 102 in the case of a refresh operation. The signal sttz is an initializing signal, which is generated as a HIGH pulse at the time of power-on of the semiconductor memory device 100.

The configuration and operation of the pulse generating circuit 131 are the same as those of the pulse generating circuit 31 shown in FIG. 3. Namely, as shown in FIG. 4, the pulse generating circuit 131 generates a HIGH pulse in response to a falling edge of the input signal. The configuration and operation of the delay circuit 132 are the same as those of the delay circuit 32 shown in FIG. 3. Namely, as shown in FIG. 5, the output of the delay circuit 132 immediately becomes HIGH in response to a rising edge of the input signal, and becomes LOW upon the passage of a predetermined delay time following a falling edge of the input signal.

A latch comprised of the NOR gates 135 and 136 in the state detecting circuit 103 is caused by the initializing signal sttz to be in the latch state in which the output of the NOR circuit 135 is LOW. In the case of a refresh operation, rasz input into the inverter 133 becomes HIGH, so that the output of the NOR gate 134 becomes HIGH, resulting the power-supply-circuit activating signal powactz being immediately changed to HIGH. The output of the NOR gate 134 thereafter becomes LOW in response to the change into LOW of rasz upon the completion of the refresh operation. In response, the power-supply-circuit activating signal powactz is changed to LOW after the predetermined delay time.

In the case of read operation or write operation, the power-supply-circuit activating signal powactz is immediately changed to HIGH in response to the HIGH state of rasz input into the inverter 133. When the signal saez for activating sense amplifiers thereafter becomes HIGH, the output of the NAND gate 138 turns into LOW, resulting in the pulse generating circuit 131 producing a HIGH pulse. This HIGH pulse causes the state of the latch to be inverted, resulting in the output of the NOR gate 135 being HIGH. In response, the output of the NOR gate 134 is changed to LOW, and, thus, the power-supply-circuit activating signal powactz that is the output of the delay circuit 132 is changed to LOW after the predetermined delay time.

After this, a read or write operation with respect to the memory core circuit 102 starts. As the signal clpz for activating a column selecting line becomes HIGH, the output of the inverter 139 is changed to HIGH. This causes the state of the latch to be inverted, resulting in the output of the NOR gate 135 being LOW. In response, the output of the NOR gate 134 is changed to HIGH, and, thus, the power-supply-circuit activating signal powactz that is the output of the delay circuit 132 is immediately changed to HIGH.

Thereafter, the read or write operation with respect to the memory core circuit 102 comes to an end, resulting in rasz being LOW. In response, the output of the NOR gate 134 is changed to LOW, and, thus, the power-supply-circuit activating signal powactz that is the output of the delay circuit 132 is changed to LOW after the predetermined delay time.

Figure 12:
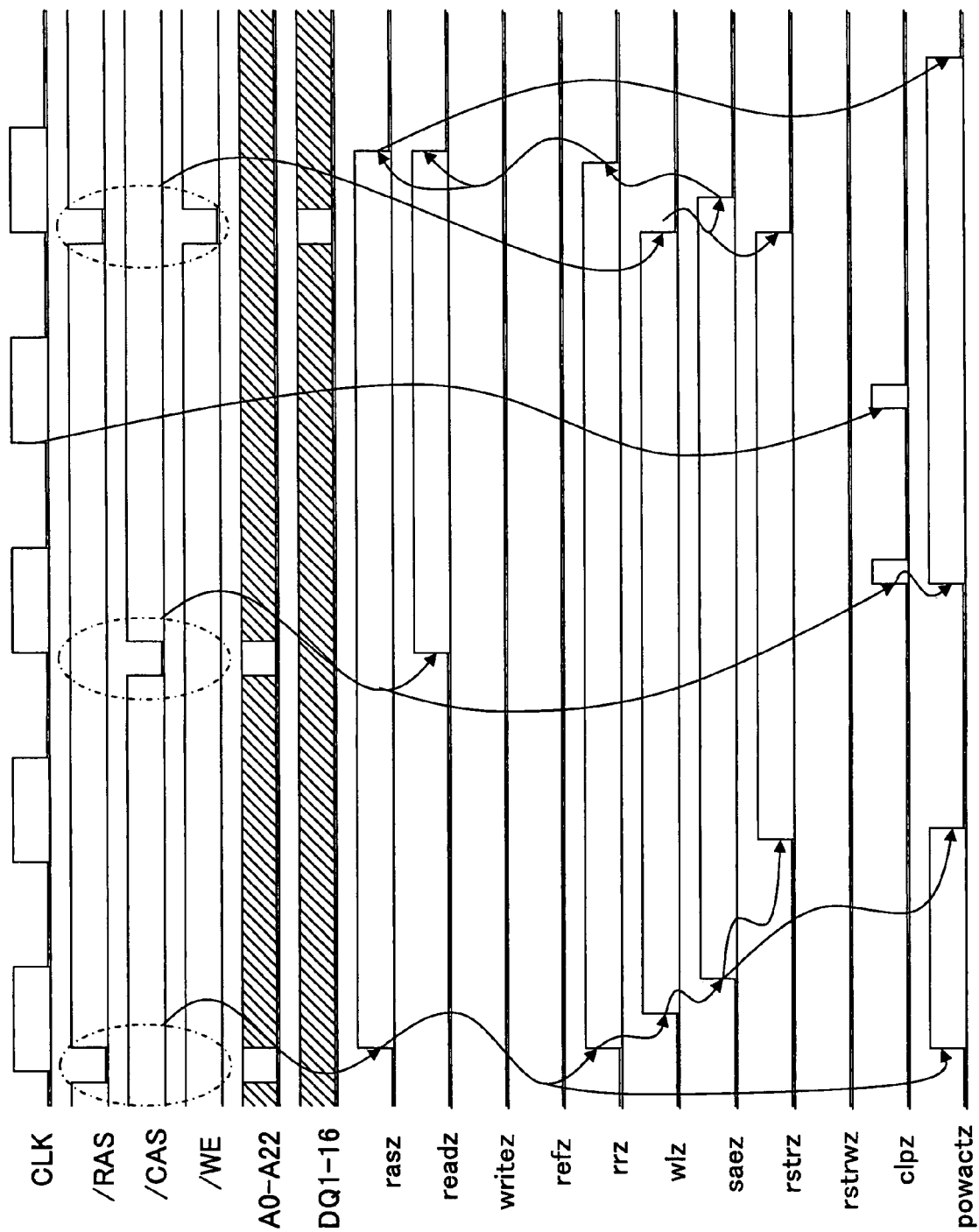
FIG. 12 is a timing chart for explaining the read operation of the semiconductor memory device shown in FIG. 10.

FIG. 12 is a timing chart for explaining the read operation of the semiconductor memory device 100 shown in FIG. 10. The read operation of the semiconductor memory device 100 will be described below by referring to FIG. 12.

The memory core circuit 102 is activated by the active command defined as /RAS=L, /CAS=H, and /WE=H. The signal rasz is set to HIGH when the memory core circuit 102 is activated In response, the power-supply-circuit activating signal powactz is changed to HIGH to place the power supply circuit 104 in the active state. Further, a block selecting signal rrz is changed to HIGH, thereby selecting one of a plurality of blocks provided in the memory core circuit 102.

In response to the HIGH state of rrz, the word-line activating signal w/z becomes HIGH, so that one word line WL is activated in the selected block. In response to the HIGH state of w/z, the sense-amplifier activating signal saez becomes HIGH, so that the sense amplifiers in the selected block are activated.

In response to the HIGH state of saez, the restore completion signal rstrz becomes HIGH. Further, the power-supply-circuit activating signal powactz is changed to LOW after the passage of a predetermined delay time following the LOW-to-HIGH transition of saez, thereby placing the power supply circuit 104 in the standby state.

After this, the signal readz becomes HIGH in response to a read command defined as /RAS=H, /CAS=L, and /WE=H. Also, a HIGH pulse is generated as the column-selecting-line activating signal clpz. In response to the HIGH state of clpz, the power-supply-circuit activating signal powactz is changed to HIGH to place the power supply circuit 104 in the active state. During a read operation, clpz is generated from the clock signal CLK to read the next data from the memory core circuit 102.

At the end, the memory core circuit 102 is deactivated by a precharge command defined as /RAS=L, /CAS=H, and /WE=L. Namely, w/z becomes LOW to deactivate the word line WL. After this, saez becomes LOW in response to the LOW state of w/z, deactivating the sense amplifiers. Further, rrz becomes LOW in response to the LOW state of saez, thereby deactivating the block selection. readz then becomes LOW in response to the LOW state of rrz, resulting in the core operation responsive to the read command coming to an end. In response to the LOW state of rasz, the power-supply-circuit activating signal powactz is changed to LOW to place the power supply circuit 104 back in the standby state.

Figure 13:
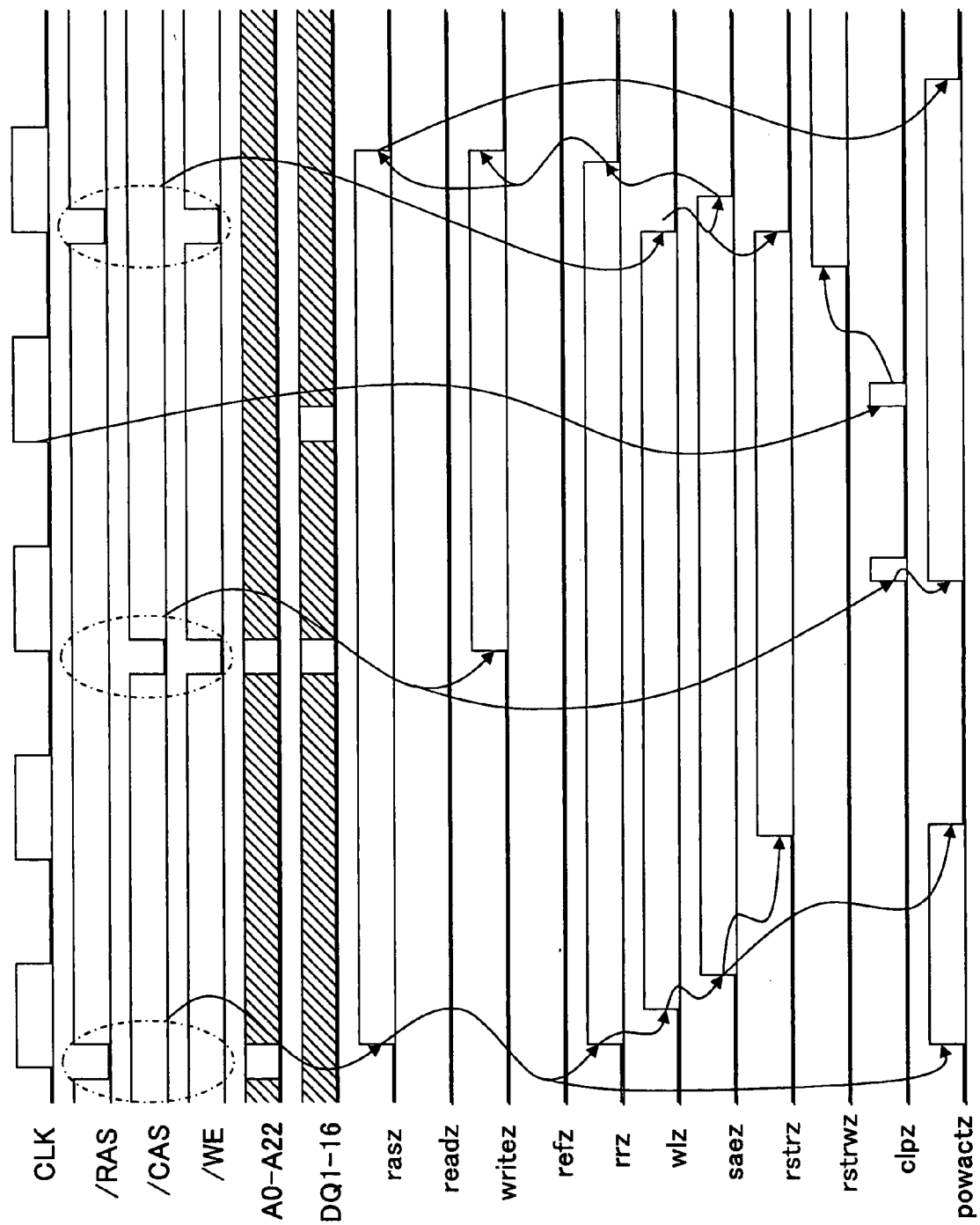
FIG. 13 is a timing chart for explaining the write operation of the semiconductor memory device shown in FIG. 10.

FIG. 13 is a timing chart for explaining the write operation of the semiconductor memory device 100 shown in FIG. 10. The write operation of the semiconductor memory device 100 will be described below by referring to FIG. 13.

The memory core circuit 102 is activated by the active command defined as /RAS=L, /CAS=H, and /WE=H. The signal rasz is set to HIGH when the memory core circuit 102 is activated In response, the power-supply-circuit activating signal powactz is changed to HIGH to place the power supply circuit 104 in the active state. Further, a block selecting signal rrz is changed to HIGH, thereby selecting one of a plurality of blocks provided in the memory core circuit 102.

In response to the HIGH state of rrz, the word-line activating signal w/z becomes HIGH, so that one word line WL is activated in the selected block. In response to the HIGH state of w/z, the sense-amplifier activating signal saez becomes HIGH, so that the sense amplifiers in the selected block are activated.

In response to the HIGH state of saez, the restore completion signal rstrz becomes HIGH. Further, the power-supply-circuit activating signal powactz is changed to LOW after the passage of a predetermined delay time following the LOW-to-HIGH transition of saez, thereby placing the power supply circuit 104 in the standby state.

After this, the signal writez becomes HIGH in response to a read command defined as /RAS=H, /CAS=L, and /WE=L. Also, a HIGH pulse is generated as the column-selecting-line activating signal clpz. In response to the HIGH state of clpz, the power-supply-circuit activating signal powactz is changed to HIGH to place the power supply circuit 104 in the active state. During a write operation, clpz is generated from the clock signal CLK to write the next data to the memory core circuit 102. In response to clpz, the signal rstrwz becomes HIGH to indicate that the restoration of data written to the memory core circuit 102 is sufficient.

At the end, the memory core circuit 102 is deactivated by a precharge command defined as /RAS=L, /CAS=H, and /WE=L. Namely, w/z becomes LOW to deactivate the word line WL. After this, saez becomes LOW in response to the LOW state of w/z, deactivating the sense amplifiers. Further, rrz becomes LOW in response to the LOW state of saez, thereby deactivating the block selection. writez then becomes LOW in response to the LOW state of rrz, resulting in the core operation responsive to the write command coming to an end. In response to the LOW state of rasz, the power-supply-circuit activating signal powactz is changed to LOW to place the power supply circuit 104 back in the standby state.

Figure 14:
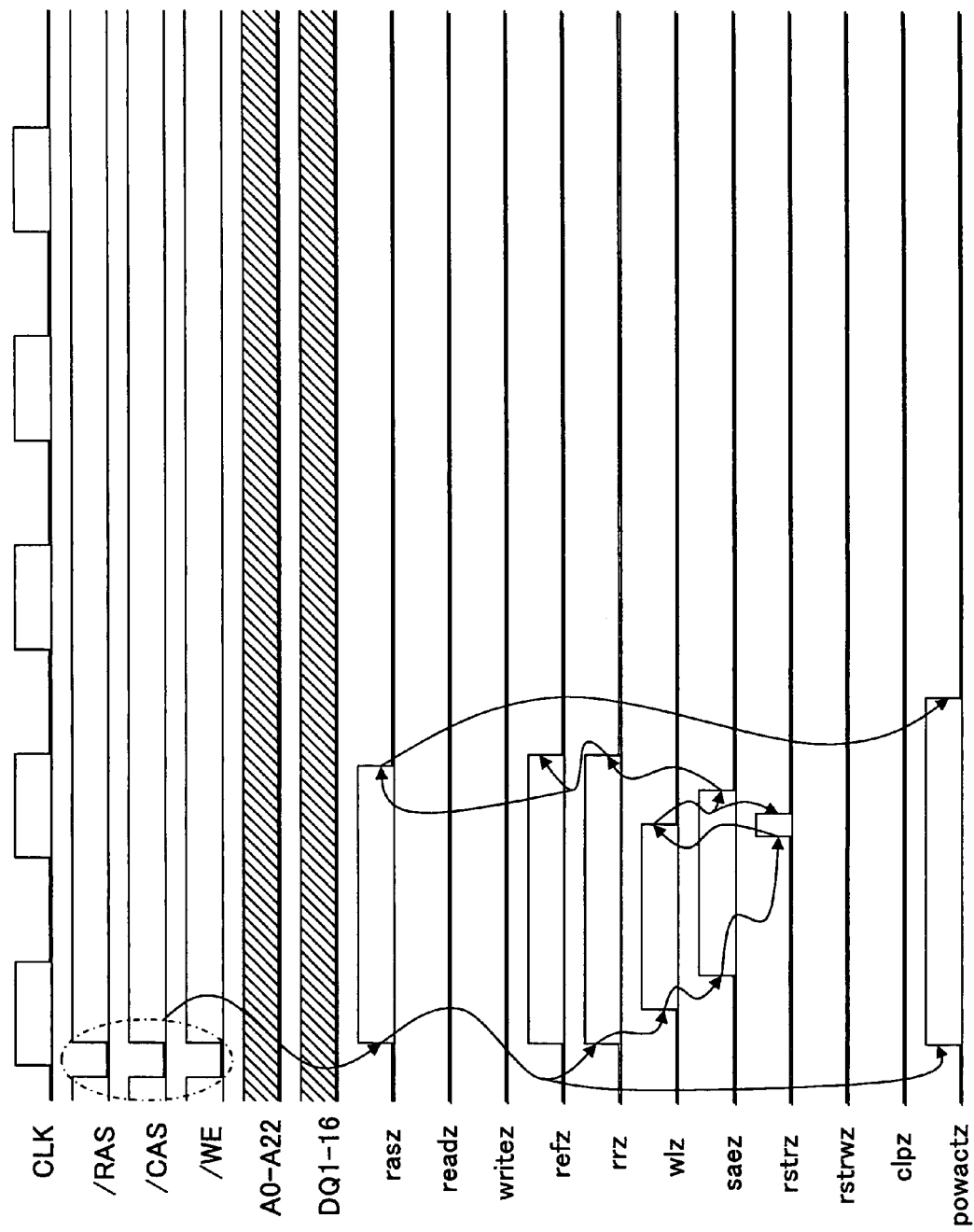
FIG. 14 is a timing chart for explaining the refresh operation of the semiconductor memory device shown in FIG. 10.

FIG. 14 is a timing chart for explaining the refresh operation of the semiconductor memory device 100 shown in FIG. 10. The refresh operation of the semiconductor memory device 100 will be described below by referring to FIG. 14.

refz and rasz become HIGH by a refresh command defined as /RAS=L, /CAS=L, and /WE=L. In response to the HIGH state of rasz, the power-supply-circuit activating signal powactz is changed to HIGH to place the power supply circuit 104 in the active state.

Further, a block selecting signal rrz is changed to HIGH, thereby selecting one of a plurality of blocks provided in the memory core circuit 12. In response to the HIGH state of rrz, the word-line activating signal w/z becomes HIGH, so that one word line WL is activated in the selected block. In response to the HIGH state of w/z, the sense-amplifier activating signal saez becomes HIGH, so that the sense amplifiers in the selected block are activated.

In response to the HIGH state of saez, the restore completion signal rstrz becomes HIGH. The ongoing operation is a refresh operation in this example, so that w/z is changed to LOW in response to the HIGH state of rstrz, thereby deactivating the word line WL. After this, saez becomes LOW in response to the LOW state of w/z, deactivating the sense amplifiers. Further, rrz becomes LOW in response to the LOW state of saez, thereby deactivating the block selection. refz then becomes LOW in response to the LOW state of rrz, resulting in the core operation of the refresh operation coming to an end. In response to the LOW state of rasz, the power-supply-circuit activating signal powactz is changed to LOW to place the power supply circuit 104 back in the standby state.

As described above, the semiconductor memory device 100 of FIG. 10 is configured such that the power supply circuit 104 is placed in the active state at all times during the operation of memory core circuit 12 in the case of a refresh operation. In the case of a read operation and a write operation, on the other hand, even during the ongoing operation of the memory core circuit 102, the power supply circuit 104 is shifted from the active state to the standby state to reduce power consumption when a word line and sense amplifiers are activated in a wait state waiting for data to be read or written. In this manner, semiconductor memory devices to which the present invention is applicable are not limited to an SRAM-compatible DRAM, but include an ordinary DRAM as shown in FIG. 10.

Further, the present invention is not limited to these embodiments, but various variations and modifications may be made without departing from the scope of the present invention.

What is claimed is:

1. A semiconductor memory device, comprising:
a DRAM memory core circuit including a word line;
a power supply circuit configured to operate in a selected one of a first state and a second state to generate a predetermined power supply voltage for provision to the DRAM memory core circuit, the power supply circuit consuming a larger electric current in the first state than in the second state; and
a control circuit configured to control the power supply circuit such that the power supply circuit is shifted from the first state to the second state and is then brought back to the first state based on a sense-amplifier activating signal during a period from activation of the word line to deactivation of the word line.

2. The semiconductor memory device as claimed in claim 1, wherein the semiconductor memory device has an SRAM-compatible input/output interface, and wherein the control circuit is configured to control the power supply circuit in a write operation such that the power supply circuit is shifted from the first state to the second state, and is then brought back to the first state during the period from the activation of the word line to the deactivation of the word line, and is configured to control the power supply circuit in a read operation and a refresh operation such that the power supply circuit is kept in the first state during the period from the activation of the word line to the deactivation of the word line.

3. The semiconductor memory device as claimed in claim 1, wherein the control circuit is configured to control the power supply circuit in a write operation and a read operation such that the power supply circuit is shifted from the first state to the second state and is then brought back to the first state during the period from the activation of the word line to the deactivation of the word line, and is configured to control the power supply circuit in a refresh operation such that the power supply circuit is kept in the first state during the period from the activation of the word line to the deactivation of the word line.

4. The semiconductor memory device as claimed in claim 1, wherein the power supply circuit is configured to respond to a variation in the power supply voltage with a faster response speed, in the first state than in the second state, and to restore the power supply voltage to a predetermined level.

5. The semiconductor memory device as claimed in claim 1, wherein the power supply circuit includes:
a detection circuit configured to change an output thereof in response to a level of the power supply voltage;
an oscillator circuit configured to output an oscillating signal in response to the output of the detection circuit; and
a pump circuit configured to generate the power supply voltage in response to the oscillating signal of the oscillator circuit,
wherein the detection circuit consumes a larger electric current and responds with a faster response speed in the first state than in the second state, and the oscillator circuit consumes a larger electric current and has a shorter oscillating cycle of the oscillating signal in the first state than in the second state.

6. The semiconductor memory device as claimed in claim 5, wherein the detection circuit includes:
a first detector; and
a second detector, and
wherein the oscillator circuit includes:
a first oscillator configured to output a first oscillating signal in response to an output of the first detector;

a second oscillator configured to output a second oscillating signal in response to an output of the second detector; and a selector configured to select and output one of the first oscillating signal and the second oscillating signal.

7. The semiconductor memory device as claimed in claim 1, wherein the sense amplifier activating signal activates sense amplifiers of the DRAM memory core circuit.

8. The semiconductor memory device as claimed in claim 1, wherein the control circuit is configured to shift the power supply circuit from the first state to the second state upon passage of a predetermined delay time following assertion of the sense amplifier activating signal.

9. The semiconductor memory device as claimed in claim 8, wherein the control circuit is configured to maintain the power supply circuit in the first state without placing the power supply circuit in the second state in response to activation of a column-selecting-line activating signal prior to the passage of the predetermined delay time following the assertion of the sense amplifier activating signal, the column-selecting-line activating signal serving to activate a column selecting line of the DRAM memory core circuit.

10. The semiconductor memory device as claimed in claim 1, wherein the control circuit is configured to bring back the power supply circuit from the second state to the first state in response to a column-selecting-line activating signal that activates a column selecting line of the DRAM memory core circuit.

11. The semiconductor memory device as claimed in claim 6, wherein a current consumption of the first detector is larger than a current consumption of the second detector and a response speed of the first detector is faster than a response speed of the second detector, and the first detector is operated in accordance with an activate signal activating the power supply circuit.

12. The semiconductor memory device as claimed in claim 11, the second detector is constantly operated.

13. The semiconductor memory device as claimed in claim 12, wherein the selector selects one of the first oscillating signal and the second oscillating signal in accordance with the activate signal.

14. A semiconductor memory device, comprising:

a DRAM memory core circuit including a word line;

a power supply circuit configured to operate in a selected one of a first state and a second state to generate a predetermined power supply voltage for provision to the DRAM memory core circuit, the power supply circuit consuming a larger electric current in the first state than in the second state; and a control circuit configured to control the power supply circuit such that the power supply circuit is shifted from the first state to the second state and is then brought back to the first state during a period from activation of the word line to deactivation of the word line, wherein the control circuit is configured to control the power supply circuit in a write operation and a read operation such that the power supply circuit is shifted from the first state to the second state and is then brought back to the first state during the period from the activation of the word line to the deactivation of the word line, and is configured to control the power supply circuit In a refresh operation such that the power supply circuit is kept in the first state during the period from the activation of the word line to the deactivation of the word line.

15. A semiconductor memory device, comprising:

a DRAM memory core circuit including a word line;

a power supply circuit configured to operate in a selected one of a first state and a second state to generate a predetermined power supply voltage for provision to the DRAM memory core circuit, the power supply circuit consuming a larger electric current in the first state than in the second state; and a control circuit configured to control the power supply circuit such that the power supply circuit is shifted from the first state to the second state and is then brought back to the first state during a period from activation of the word line to deactivation of the word line, wherein the power supply circuit includes:

a detection circuit configured to change an output thereof in response to a level of the power supply voltage;

an oscillator circuit configured to output an oscillating signal in response to the output of the detection circuit; and a pump circuit configured to generate the power supply voltage in response to the oscillating signal of the oscillator circuit, wherein the detection circuit consumes a larger electric current and responds with a faster response speed in the first state than in the second state, and the oscillator circuit consumes a larger electric current and has a shorter oscillating cycle of the oscillating signal in the first state than in the second state.

* * * * *